(12) United States Patent
Meruva et al.

(10) Patent No.: US 12,095,893 B2
(45) Date of Patent: Sep. 17, 2024

(54) WIDE FREQUENCY PHASE INTERPOLATOR

(71) Applicant: QUALCOMM Incorporated, San Diego, CA (US)

(72) Inventors: Anand Meruva, San Diego, CA (US); Jeffrey Mark Hinrichs, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 0 days.

(21) Appl. No.: 17/946,798

(22) Filed: Sep. 16, 2022

(65) Prior Publication Data

US 2024/0097873 A1     Mar. 21, 2024

(51) Int. Cl.
*H04L 7/00*     (2006.01)
*G06F 13/42*    (2006.01)

(52) U.S. Cl.
CPC .......... *H04L 7/0025* (2013.01); *H04L 7/0029* (2013.01); *G06F 13/4291* (2013.01)

(58) Field of Classification Search
CPC ................. H04L 7/0025–0041; G06F 13/4291
See application file for complete search history.

(56) References Cited

U.S. PATENT DOCUMENTS

| 9,559,706  | B1* | 1/2017  | King ...................... H03K 5/13 |
| 9,698,968  | B2* | 7/2017  | Bonaccio .............. H03L 7/0814 |
| 2007/0160173 | A1* | 7/2007 | Takeuchi ................ H03M 9/00 |
|  |  |  | 375/355 |
| 2014/0169435 | A1 | 6/2014 | Choi et al. |
| 2015/0188693 | A1* | 7/2015 | Giaconi ................ H04L 7/0331 |
|  |  |  | 375/373 |
| 2019/0265278 | A1* | 8/2019 | Wei ..................... G01R 13/0272 |
| 2021/0036707 | A1* | 2/2021 | Han ................... H04L 25/03885 |
| 2021/0248103 | A1* | 8/2021 | Khashaba ............. H04L 7/0087 |
| 2022/0255550 | A1 | 8/2022 | Palmer et al. |
| 2022/0345231 | A1* | 10/2022 | Yilmazer ............... H04B 17/21 |

OTHER PUBLICATIONS

International Search Report and Written Opinion—PCT/US2023/070925—ISA/EPO—Nov. 28, 2023.

\* cited by examiner

*Primary Examiner* — Jonathan A Bui
(74) *Attorney, Agent, or Firm* — Loza & Loza, LLP

(57) ABSTRACT

A phase interpolator includes a sampling circuit configured to capture samples of an output of the phase interpolator, a delay circuit configured to delay sampling by the sampling circuit, a comparator configured to provide a comparison signal that indicates whether voltage of the samples exceed a reference voltage, and a counter responsive to the comparison signal and configured to provide an output that controls an operating point of the phase interpolator. The phase interpolator my further include a pair of driver circuits configured to concurrently drive the output of the phase interpolator.

30 Claims, 7 Drawing Sheets

WIDE FREQUENCY PHASE INTERPOLATOR

TECHNICAL FIELD

The present disclosure generally relates to a clock and data recovery circuits and, more particularly, to circuitry for generating multiple clock signals at different phases.

BACKGROUND

Electronic device technologies have seen explosive growth over the past several years. For example, growth of cellular and wireless communication technologies has been fueled by better communications, hardware, larger networks, and more reliable protocols. Wireless service providers are now able to offer their customers an ever-expanding array of features and services, and provide users with unprecedented levels of access to information, resources, and communications. To keep pace with these service enhancements, mobile electronic devices (e.g., cellular phones, tablets, laptops, etc.) have become more powerful and complex than ever. Wireless devices may include a high-speed bus interface for communication of signals between hardware components.

High-speed serial buses offer advantages over parallel communication links when, for example, there is demand for reduced power consumption and smaller footprints in integrated circuit (IC) devices. In a serial interface, data is converted from parallel words to a serial stream of bits using a serializer and is converted back to parallel words at the receiver using a deserializer. For example, the high-speed bus interface may be implemented using a Peripheral Component Interconnect Express (PCIe) bus, Universal Serial Bus (USB) or Serial Advanced Technology Attachment (SATA), among others.

IC devices may include a serializer/deserializer (SERDES) to transmit and receive through a serial communication link. In high-speed applications, timing of the operation of a SERDES may be controlled by multiple clock signals. The use of multiple increased frequency clock signals results in increased power consumption. Furthermore, the SERDES generally receives clock signals that have the same frequency but different phases. Performance, accuracy or reliability of the SERDES may depend on frequency and the phase relationships of the clock signals and drift or other variations in the phase relationships of clock signals can result in errors in received data. Therefore, there is an ongoing need for new techniques that provide reliable lower-power clock generation and calibration circuits for components used to receive clock signals over high-speed serial links.

SUMMARY

Certain aspects of the disclosure relate to systems, apparatus, methods and techniques for implementing and calibrating a phase interpolator that can be used with clock signals that can have a frequency that varies over a wide range of frequencies.

In various aspects of the disclosure, a phase interpolator includes a sampling circuit configured to capture samples of an output of the phase interpolator, a delay circuit configured to delay sampling by the sampling circuit, a comparator configured to provide a comparison signal that indicates whether voltage of the samples exceed a reference voltage, and a counter responsive to the comparison signal and configured to provide an output that controls an operating point of the phase interpolator. The phase interpolator my further include a pair of driver circuits configured to concurrently drive the output of the phase interpolator.

In various aspects of the disclosure, an apparatus includes means for capturing samples of an output of the apparatus. The means for capturing samples may include a delay circuit configured to delay sampling by a sampling circuit. The apparatus may further include means for providing a comparison signal that indicates whether voltage of the samples exceed a reference voltage, and means for generating a control signal that is responsive to the comparison signal and that is configured to control an operating point of the apparatus. The apparatus may further include means for generating an output signal representative of a weighted sum of a pair of input signals received by the apparatus. The means for generating an output signal may include a pair of driver circuits configured to concurrently drive the output of the apparatus. The pair of input signals may have a same frequency and are phase-shifted with respect to one another.

In various aspects of the disclosure, a method for operating a phase interpolator circuit includes capturing samples of an output of the phase interpolator circuit using a sampling circuit and a delay circuit configured to delay sampling by the sampling circuit, providing a comparison signal that indicates whether voltage of the samples exceed a reference voltage, and generating a control signal that is responsive to the comparison signal and that is configured to control an operating point of the phase interpolator circuit. The method may also include generating an output signal representative of a weighted sum of a pair of input signals received by the phase interpolator circuit using a pair of driver circuits configured to concurrently drive the output of the phase interpolator circuit. The pair of input signals may have a same frequency and are phase-shifted with respect to one another.

In certain aspects, the output of the counter may be used to configure one or more biasing circuits in the pair of driver circuits. The output of the counter may configure one or more current sources used to configure the pair of driver circuits. The output of the counter may configure a digitally controlled voltage source that controls an operating point for the pair of driver circuits.

In certain aspects, the pair of driver circuits is coupled to a pair of input signals that have the same frequency and are phase-shifted with respect to one another. The pair of driver circuits may be configured to generate a weighted sum of the pair of input signals. Each driver circuit in the pair of driver circuits may include one or more load transistors configured to control a level of current contributed by the driver circuit to the output of the phase interpolator.

In certain aspects, the operating point of the phase interpolator may be configured for the frequency of the pair of input signals. The operating point of the phase interpolator can be one of a plurality of operating points configured for different frequencies of an input signal received by the phase interpolator. The sampling circuit may be configured to capture the samples during one pulse in an input signal received by the phase interpolator. The counter may be configured to count cycles of a clock signal until the comparison signal indicates that the voltage of the samples exceeds the reference voltage

DETAILED DESCRIPTION

Figure 1:
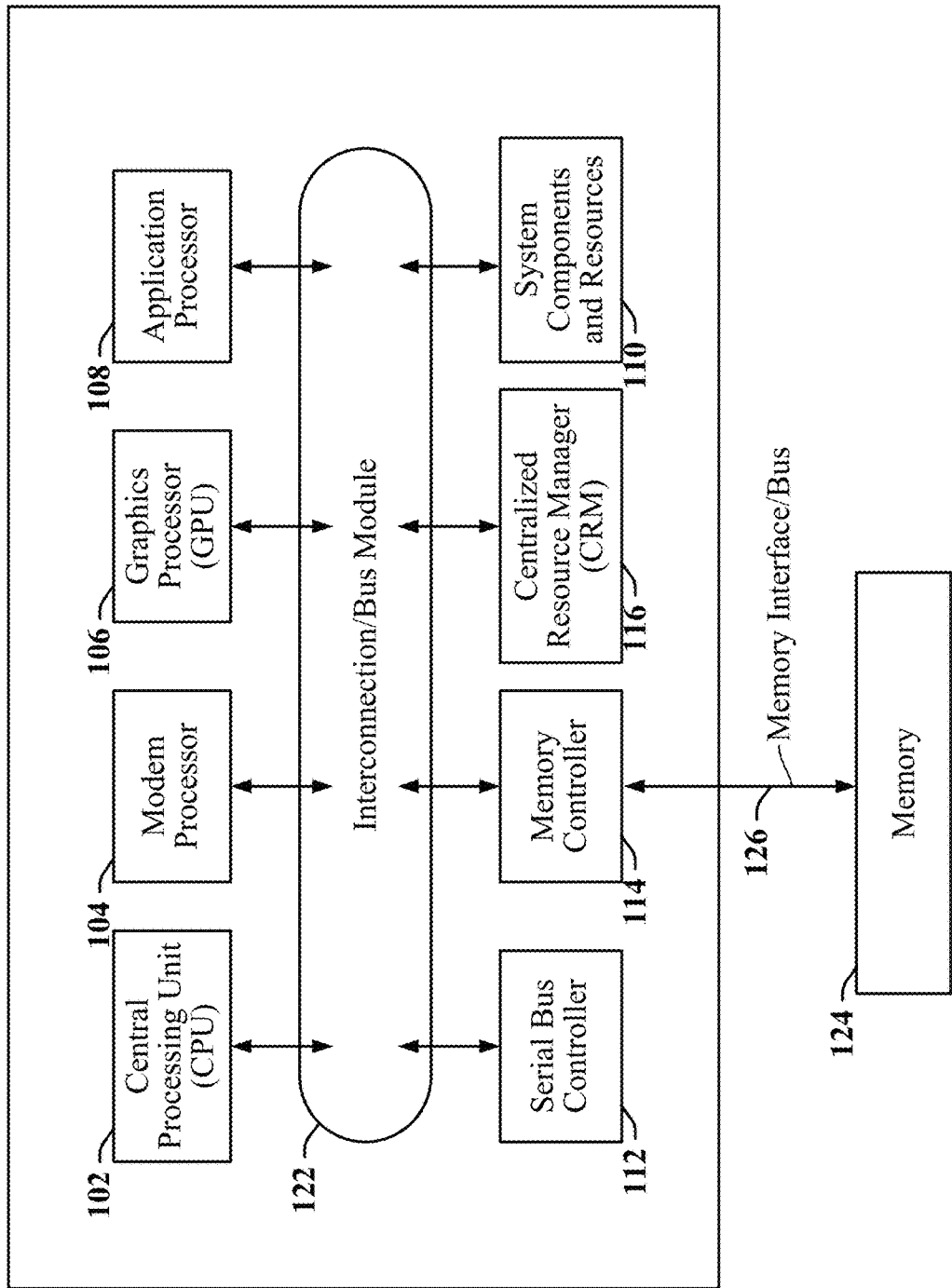
FIG. 1 illustrates example components and interconnections in a system-on-chip (SoC) that may be suitable for implementing certain aspects of the present disclosure.

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well-known structures and components are shown in block diagram form in order to avoid obscuring such concepts.

With reference now to the Figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

The terms "computing device" and "mobile device" are used interchangeably herein to refer to any one or all of servers, personal computers, smartphones, cellular telephones, tablet computers, laptop computers, netbooks, ultrabooks, palm-top computers, personal data assistants (PDAs), wireless electronic mail receivers, multimedia Internet-enabled cellular telephones, Global Positioning System (GPS) receivers, wireless gaming controllers, and similar personal electronic devices which include a programmable processor. While the various aspects are particularly useful in mobile devices (e.g., smartphones, laptop computers, etc.), which have limited resources (e.g., processing power, battery, size, etc.), the aspects are generally useful in any computing device that may benefit from improved processor performance and reduced energy consumption.

The term "multicore processor" is used herein to refer to a single integrated circuit (IC) chip or chip package that contains two or more independent processing units or cores (e.g., CPU cores, etc.) configured to read and execute program instructions. The term "multiprocessor" is used herein to refer to a system or device that includes two or more processing units configured to read and execute program instructions.

The term "system on chip" (SoC) is used herein to refer to a single integrated circuit (IC) chip that contains multiple resources and/or processors integrated on a single substrate. A single SoC may contain circuitry for digital, analog, mixed-signal, and radio-frequency functions. A single SoC may also include any number of general purpose and/or specialized processors (digital signal processors (DSPs), modem processors, video processors, etc.), memory blocks (e.g., read only memory (ROM), random access memory (RAM), flash, etc.), and resources (e.g., timers, voltage regulators, oscillators, etc.), any or all of which may be included in one or more cores.

Memory technologies described herein may be suitable for storing instructions, programs, control signals, and/or data for use in or by a computer or other digital electronic device. Any references to terminology and/or technical details related to an individual type of memory, interface, standard, or memory technology are for illustrative purposes only, and not intended to limit the scope of the claims to a particular memory system or technology unless specifically recited in the claim language. Mobile computing device architectures have grown in complexity, and now commonly include multiple processor cores, SoCs, co-processors, functional modules including dedicated processors (e.g., communication modem chips, GPS receivers, etc.), complex memory systems, intricate electrical interconnections (e.g., buses and/or fabrics), and numerous other resources that execute complex and power intensive software applications (e.g., video streaming applications, etc.).

Certain aspects of the disclosure are applicable to input/out (I/O) circuits that provide an interface between core circuits and memory devices. Many mobile devices employ Synchronous Dynamic Random Access Memory (SDRAM), including Low-Power Double Data Rate SDRAM, which may be referred to as low-power DDR SDRAM, LPDDR SDRAM or, in some instances, LPDDRx where x describes the technology generation of the LPDDR SDRAM. Later generations of LPDDR SDRAM designed to operate at higher operating frequencies may employ lower voltage levels in the core of an SoC or memory device to mitigate for increased power associated with the higher operating frequencies.

Process technology employed to manufacture semiconductor devices, including IC devices is continually improving. Process technology includes the manufacturing methods used to make IC devices and defines transistor size, operating voltages and switching speeds. Features that are constituent elements of circuits in an IC device may be referred as technology nodes and/or process nodes. The terms technology node, process node, process technology may be used to characterize a specific semiconductor manufacturing process and corresponding design rules. Faster and more power-efficient technology nodes are being continuously developed through the use of smaller feature size to produce smaller transistors that enable the manufacture of higher-density ICs.

FIG. 1 illustrates example components and interconnections in a system-on-chip (SoC) 100 that may be suitable for implementing certain aspects of the present disclosure. The SoC 100 may include a number of heterogeneous processors, such as a central processing unit (CPU) 102, a modem processor 104, a graphics processor 106, and an application processor 108. Each processor 102, 104, 106, 108, may include one or more cores, and each processor/core may perform operations independent of the other processors/cores. The processors 102, 104, 106, 108 may be organized in close proximity to one another (e.g., on a single substrate, die, integrated chip, etc.) so that the processors may operate at a much higher frequency/clock rate than would be possible if the signals were to travel off-chip. The proximity of the cores may also allow for the sharing of on-chip memory and resources (e.g., voltage rails), as well as for more coordinated cooperation between cores.

The SoC 100 may include system components and resources 110 for managing sensor data, analog-to-digital conversions, and/or wireless data transmissions, and for performing other specialized operations (e.g., decoding high-definition video, video processing, etc.). System components and resources 110 may also include components such as voltage regulators, oscillators, phase-locked loops (PLLs), peripheral bridges, data controllers, system controllers, access ports, timers, and/or other similar components used to support the processors and software clients running on the computing device. The system components and resources 110 may also include circuitry for interfacing with peripheral devices, such as cameras, electronic displays, wireless communication devices, external memory chips, etc.

The SoC 100 may further include a Universal Serial Bus (USB) or other serial bus controller 112, one or more memory controllers 114, and a centralized resource manager (CRM) 116. The SoC 100 may also include an input/output module (not illustrated) for communicating with resources external to the SoC, each of which may be shared by two or more of the internal SoC components.

The processors 102, 104, 106, 108 may be interconnected to the USB controller 112, the memory controller 114, system components and resources 110, CRM 116, and/or other system components via an interconnection/bus module 122, which may include an array of reconfigurable logic gates and/or implement a bus architecture. Communications may also be provided by advanced interconnects, such as high-performance networks on chip (NoCs).

The interconnection/bus module 122 may include or provide a bus mastering system configured to grant SoC components (e.g., processors, peripherals, etc.) exclusive control of the bus (e.g., to transfer data in burst mode, block transfer mode, etc.) for a set duration, number of operations, number of bytes, etc. In some cases, the interconnection/bus module 122 may implement an arbitration scheme to prevent multiple master components from attempting to drive the bus simultaneously. The memory controller 114 may be a specialized hardware module configured to manage the flow of data to and from memory 124 via a memory interface/bus 126.

The memory controller 114 may comprise one or more processors configured to perform read and write operations with the memory 124. Examples of processors include microprocessors, microcontrollers, digital signal processors (DSPs), field programmable gate arrays (FPGAs), programmable logic devices (PLDs), state machines, gated logic, discrete hardware circuits, and other suitable hardware configured to perform the various functionality described throughout this disclosure. In certain aspects, the memory 124 may be part of the SoC 100.

Figure 2:
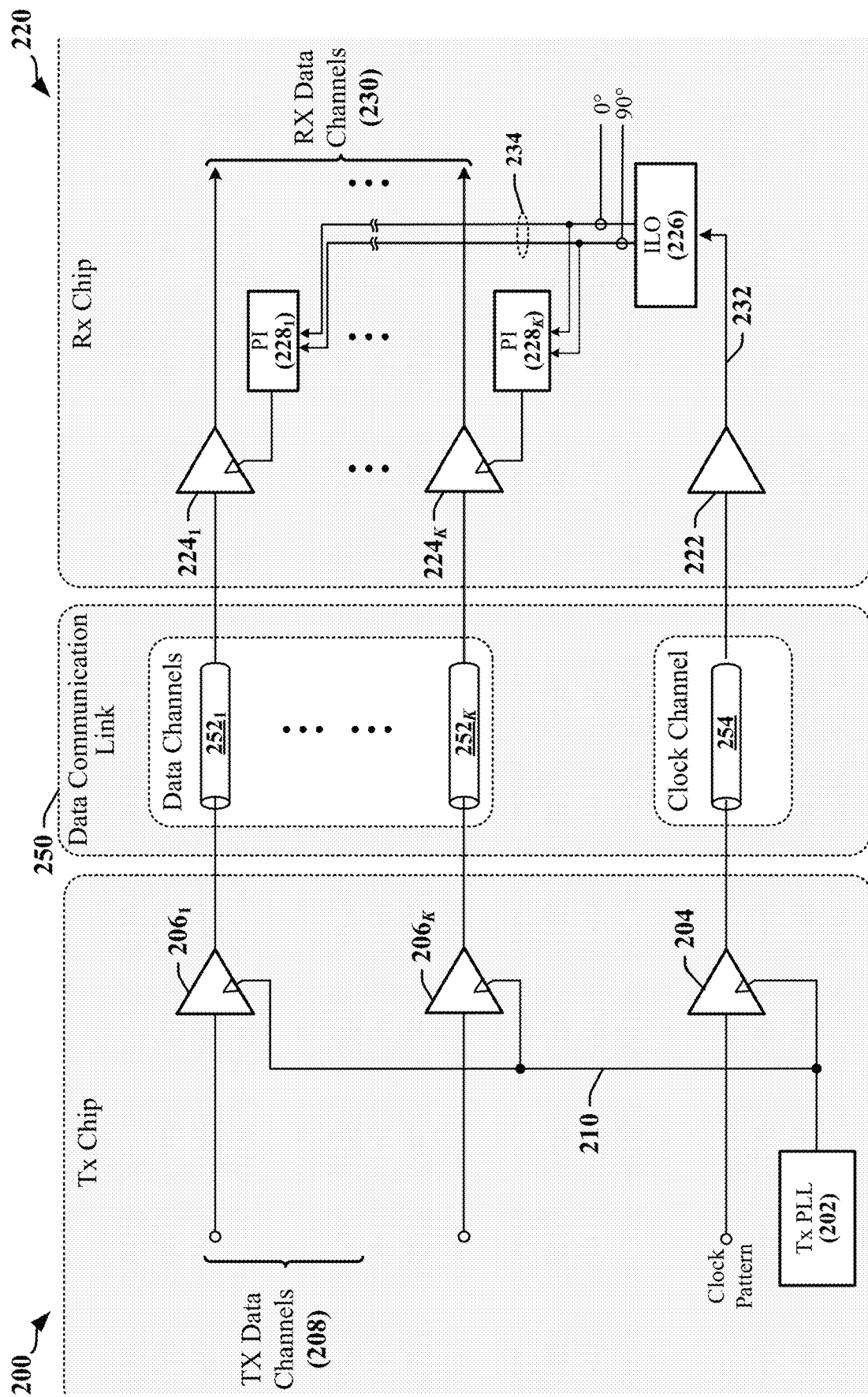
FIG. 2 illustrates an example of a system that employs a multi-channel data communication link to couple a transmitting device with a receiving device in accordance with certain aspects of the present disclosure.

FIG. 2 illustrates an example of a system that employs a multi-channel data communication link 250 to couple a transmitting device 200 with a receiving device 220. The data communication link 250 includes data channels $252_1$-$252_K$ that provide a transmission medium through which signals propagate from a first device to a second device. In the illustrated example, the transmitting device 200 can be configured to transmit data signals over one or more data channels $252_1$-$252_K$ in accordance with timing information provided by a clock signal transmitted over a clock channel 254. The transmitting device 200 may include serializers (not shown) configured to convert parallel data into serial data for transmission over the data channels $252_1$-$252_K$. The transmitting device 200 further includes data line drivers $206_1$-$206_K$ configured to generate data signals over the one or more data channels $252_1$-$252_K$ to the receiving device 220 through the data communication link 250 in accordance with timing information provided by a clock signal forwarded by a clock line driver 204 over a clock channel 254.

Clock forwarding is common in communication systems, and provides the benefit that a phase locked loop (PLL) and other clock recovery circuits are not required in the receiving device 220. Long term jitter originating with a PLL 202 in the transmitting device 200 is transparent to the system. Typically, only one phase of the transmitter-generated clock signal is forwarded to conserve power and the space that would be occupied by additional clock channels. In some examples, multiple phases of the transmitter-generated clock signal are forwarded. In some examples, the transmitter-generated clock signal is forwarded as a differential clock signal.

The receiving device 220 may be configured to receive and process the data signals. In some implementations, the receiving device 220 can generate additional phases of the clock signal to obtain in-phase and quadrature (I/Q) versions of the clock signal to be used by phase interpolators $228_1$-$228_K$. A quadrature signal has phase that is shifted by 90° with respect to an in-phase signal. The phase interpolators $228_1$-$228_K$ may provide outputs that are phase-adjusted or phase-corrected I/Q versions of the clock signal. In one example, the outputs of each of the phase interpolators $228_1$-$228_K$ are provided to sampling circuits 224_1-224K.

In some implementations, the receiving device 220 includes an injection-locked oscillator (ILO) that receives the clock signal from a line receiver 222 coupled to the clock channel 254 and generates phase-shifted versions 234 of the clock signal, including I/Q versions of the clock signal. Oscillators are fundamental building blocks of modern electronics and most often are implemented as ring oscillators (ROs), which can offer advantages over other types of oscillator including reduced area footprint, power efficiency and scalability with technological process.

In one example, the multi-channel data communication link 250 may correspond to the memory interface/bus 126 illustrated in FIG. 1 and may be used to couple a memory controller 114 to memory 124 implemented using SDRAM that can operate at multiple frequencies and voltages. Later generations of LPDDR SDRAM, including LPDDR6 (generation 6) for example, are designed to operate at higher operating frequencies and lower voltage levels than predecessor memory devices. The wide range of possible operating frequencies to be supported in certain applications can result in increased complexity of clock generation circuits in the receiving device 220. Phase interpolators $228_1$-$228_K$ that are used to generate sampling clock signals may be required to scale delay circuits for a wide range of frequency operation. For example, the Phase interpolators $228_1$-$228_K$ may be required to operate reliably within a frequency range of between 200 Mhz and 6.4 GHz.

Certain aspects of this disclosure provide a phase interpolator that can be configured to operate within the 200 Mhz and 6.4 GHz, for example. Certain implementations of the presently disclosed phase interpolator can be operated at higher and lower frequencies as needed to generate fine delays used within a receiving device.

Figure 3:
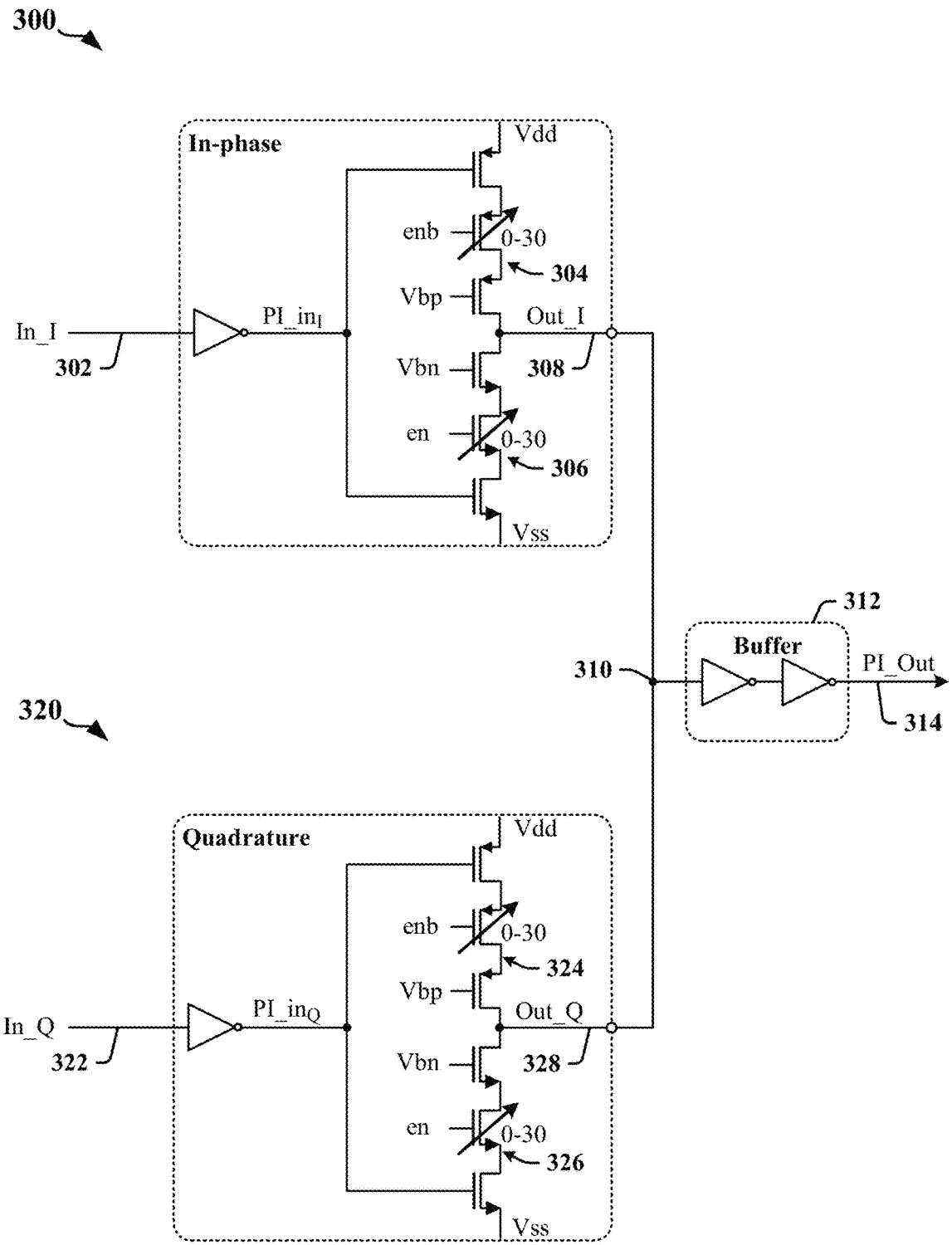
FIG. 3 illustrates certain aspects of a phase interpolator circuit configured in accordance with certain aspects of the present disclosure.
Figure 4:
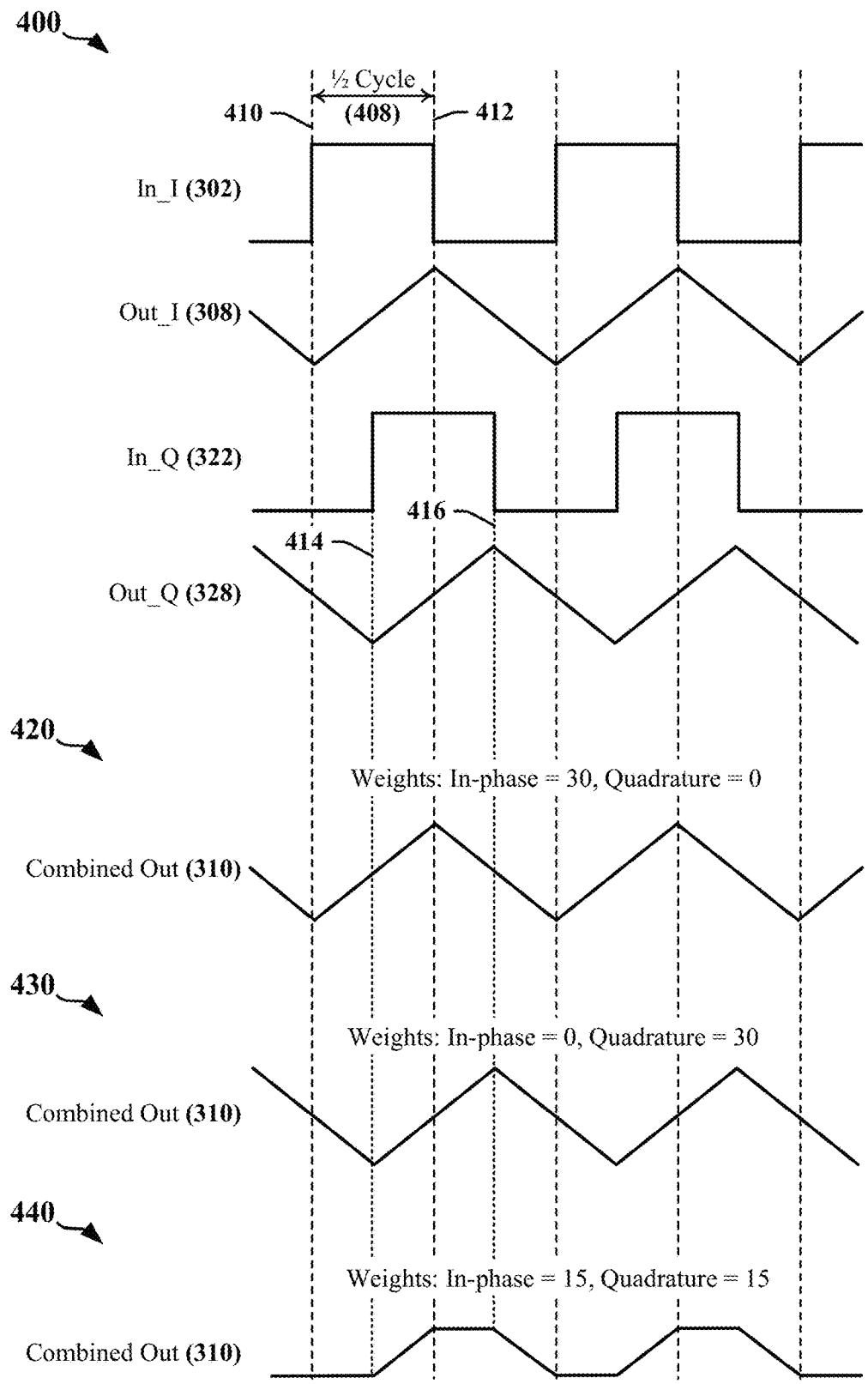
FIG. 4 illustrates the operation of the phase interpolator circuit of FIG. 3 after the phase interpolator circuit has been calibrated in accordance with certain aspects of the present disclosure.

FIG. 3 illustrates certain aspects of a phase interpolator circuit configured in accordance with certain aspects of this disclosure. FIG. 4 is a timing diagram 400 that illustrates the operation of the phase interpolator circuit after the phase interpolator circuit has been calibrated for the frequency of a clock signal provided to the phase interpolator circuit. In some implementations, the phase interpolator circuit includes or is coupled to a circuit that provides I/Q versions of the clock signal. In some implementations, an oscillator circuit outputs I/Q versions of the clock signal.

The phase interpolator circuit includes two driver circuits 300 and 320 that are configured to drive a common output 310 with configurable weightings. In the illustrated example, the driver circuits 300 and 320 may operate in the manner of binary inverters. A first driver circuit 300 receives an input signal 302 (In_I) that is an in-phase version of the clock signal and contributes an output current through its output 308 at a current level controllable using the variable load transistors 304 and 306. A second driver circuit 320 receives an input signal 322 (In_Q) that is a quadrature version of the clock signal and contributes an output current through its output 328 at a current level controllable using the variable load transistors 324 and 326. The driver circuits 300 and 320 can contribute to the common output 310 by sourcing or sinking their respective output currents. The contributions of the driver circuits 300 and 320 to the instantaneous amplitude of current flowing through the common output 310 may be additive or subtractive according to the phase of the clock signal provided to the phase interpolator circuit.

In the illustrated example, the clock signal has a 50% duty cycle and can be characterized as having equal-duration half-cycles such that the clock signal is nominally in a first signaling state during the first half-cycle and in a second signaling state during the second half-cycle. The driver circuits 300 and 320 are configured to follow their respective input signals 302, 322 while slowing transitions in their respective outputs 308, 328.

In the illustrated example, the input signal 302 received by the first driver circuit 300 begins a transition from a low signaling state to a high signaling state at the beginning 410 of a half-cycle 408 of the clock signal and begins a transition back to the low signaling state at the end 412 of the half-cycle 408 of the clock signal. The high signaling state may be represented by a first voltage level or a first current level while the low signaling state may be represented by a second voltage level or a second current level. In one example, the first voltage level is more positive than the second voltage level. In another example, the first voltage level is more negative than the second voltage level. In another example, the first voltage level and the second voltage level have different signs. In another example, the first current has a greater amplitude than the second current. In another example, the first current has a lower amplitude than the second current. In another example, the first current and the second current flow in different directions. The output 308 of the first driver circuit 300 begins to rise at the beginning 410 of the half-cycle 408 and nominally reaches the high signaling state at the end 412 of the half-cycle 408. The output 308 of the first driver circuit 300 begins to fall at the end 412 of the half-cycle 408.

The input signal 322 received by the second driver circuit 320 begins a transition from the low signaling state to the high signaling state at a time 414 occurring a quarter of a clock cycle after the beginning 410 of the half-cycle 408 of the clock signal and begins a transition back to the low signaling state at a time 416 occurring a quarter of a clock cycle after the end 412 of the half-cycle 408 of the clock signal. The output 328 of the second driver circuit 320 begins to rise at time 414 and nominally reaches the high signaling state at time 416. The output 308 of the first driver circuit 300 begins to fall at time 416.

According to certain aspects of this disclosure, the output of the phase interpolator represents the weighted sum of the outputs 308, 328 of the two driver circuits 300 and 320. The weight applied to the output of the first driver circuit 300 is determined by variable load transistors 304 and 306 and the weight applied to the output of the second driver circuit 320 is determined by variable load transistors 324 and 326. The relative weighting of the outputs 308, 328 of the two driver circuits 300 determines the time at which transitions in the common output 310 cause a buffer circuit 312 to begin a transition in the phase interpolator output 314. The buffer circuit 312 may be configured to condition the phase interpolator output 314. For example, the buffer circuit 312 may be configured to square the edges in the phase interpolator output 314 such that transitions in the phase interpolator output 314 represent a small fraction of the duration of the half-cycle 408 of the clock signal. In some implementations, each transition occupies less than 10% of the duration of the half-cycle 408 of the clock signal. In some implementations, each transition occupies less than 5% of the duration of the half-cycle 408 of the clock signal. In other implementations, the duration of transitions can be defined by tolerances and specifications specified during design.

In the illustrated example, each of the variable load transistors 304, 306, 324 and 326 can be configured to select a weighting value that ranges between zero and 30. The combination or permutations of weights can be used to generate a signal with a phase angle within a range bounded by the phases of the in-phase and quadrature versions of the clock signal.

In a first illustrated weighting example 420, the variable load transistors 304 and 306 are configured to apply a maximum weight (30) to the current contributed through the output 308 of the first driver circuit 300 and the variable load transistors 324 and 326 are configured to apply a minimum weight—nominally zero weight—to the current contributed through the output 328 of the second driver circuit 320. In this example, the second driver circuit 320 does not contribute to the common output 310 and the phase interpolator output 314 follows the input signal 302 received by the first driver circuit 300. In this example, the phase interpolator output 314 may be considered to represent the in-phase version of a clock signal used to control timing of data receive circuits.

In a second illustrated weighting example 430, the variable load transistors 304 and 306 are configured to apply a minimum weight—nominally zero weight—to the current contributed through the output 308 of the first driver circuit 300 and the variable load transistors 324 and 326 are configured to apply a maximum weight (30) to the current contributed through the output 328 of the second driver circuit 320. In this example, the first driver circuit 300 does not contribute to the common output 310 and the phase interpolator output 314 follows the input signal 322 received by the second driver circuit 300. In this example, the phase interpolator output 314 may be considered to represent the quadrature version of a clock signal used to control timing of data receive circuits.

In a third illustrated weighting example 440, the driver circuits 300 and 320 are configured with equal weights. The current contributed through the output 308 of the first driver circuit 300. The variable load transistors 304 and 306 are configured to apply a mid-range weight (15) to the current contributed through the output 308 of the first driver circuit 300 and the variable load transistors 324 and 326 are configured to apply the mid-range weight (15) to the current contributed through the output 328 of the second driver circuit 320. In this example, the first driver circuit 300 and the second driver circuit 320 contribute equally causing transitions in the common output 310 to lag transitions in the input signal 302 received by the first driver circuit 300 by a 45° phase angle and to lead transitions in the input signal 322 received by the second driver circuit 320 by a 45° phase angle. In this example, the phase interpolator output 314 phase interpolator output 314 may be considered to represent a quarter-phase version of a clock signal used to control timing of data receive circuits.

The modes of operation illustrated in FIG. 4 for the phase interpolator circuit illustrated in FIG. 3 are effective for a clock signal that operates at a calibration frequency or within a narrow band of frequencies around the calibration frequency. As used herein, the calibration frequency corresponds to the frequency of the input clock signal when the phase interpolator circuit is calibrated. The frequency of the clock signal defines the duration of the half-cycle 408 of the clock signal and thereby defines certain limits for the operation of the phase interpolator circuit. For example, the driver circuits 300 and 320 can be configured to select a phase bounded by the phases of the in-phase and quadrature versions of the clock signal when the rise time for a transition in the outputs 308, 328 of the driver circuits 300 and 320 is calibrated to be substantially equal to the duration of the half-cycle 408 of the clock signal.

Changes in duration of the half-cycle 408 of the clock signal can render the phase interpolator circuit ineffective in a system that expects the input clock signal to vary over a wide range of frequencies. For example, the half-cycle 408 of the clock signal can vary between 2.5 ns and 0.78 ns when the clock frequency is expected to vary between 200 Mhz and 6.4 GHz. Furthermore, variations in rise times in the driver circuits 300 and 320 can vary significantly due to process, voltage and temperature (PVT) variations and such PVT variations may limit the number and magnitude of phase angles that can be added by the phase interpolator circuit.

A phase interpolator circuit provided in accordance with certain aspects of this disclosure may be calibrated for use over large operating frequency ranges and in view of PVT. In one aspect, the drive strength of the driver circuits 300 and 320 may be controlled to configure rise times according to the input clock frequency.

Figure 5:
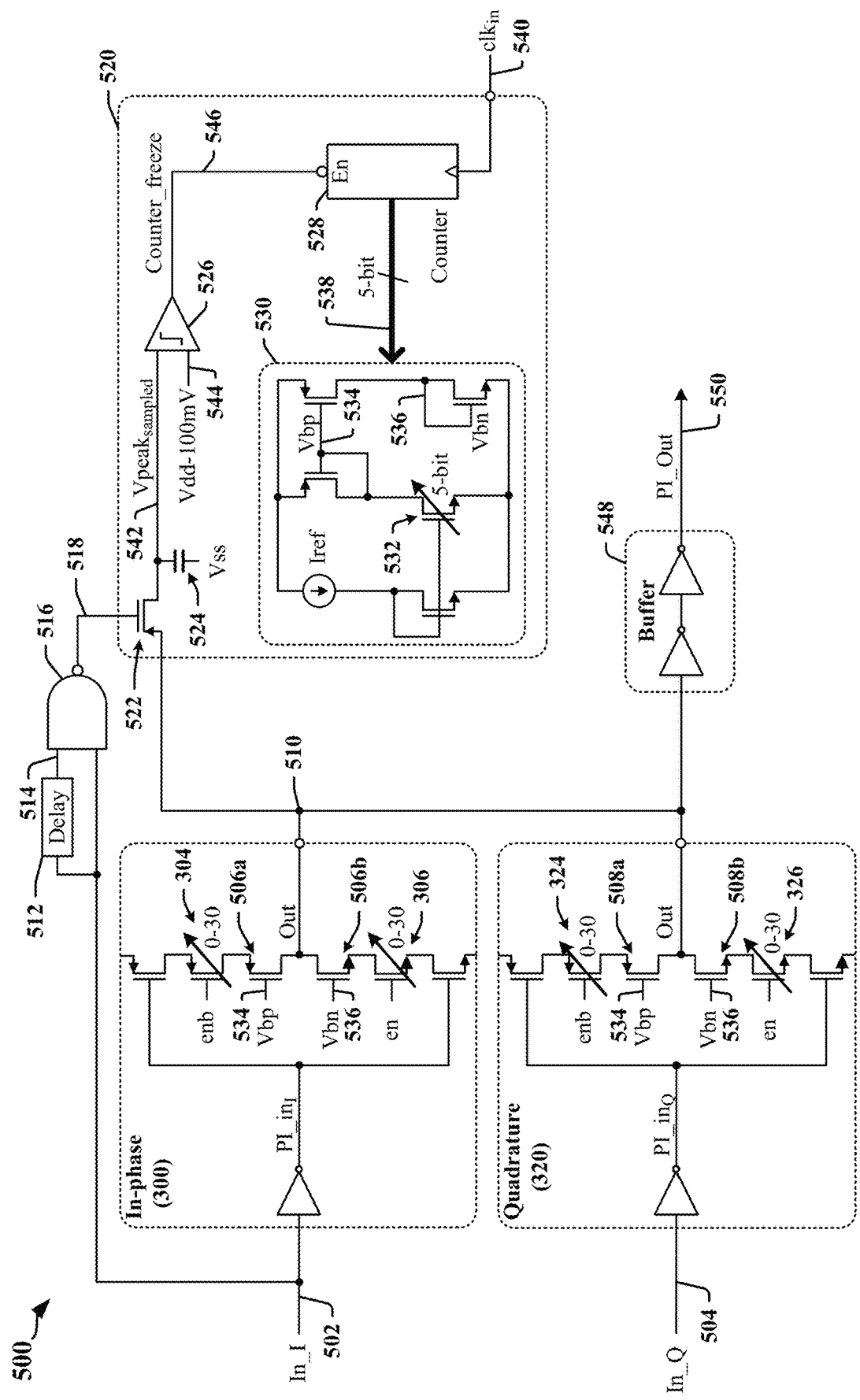
FIG. 5 illustrates an example of a phase interpolator circuit that that includes a calibration circuit in accordance with certain aspects of the present disclosure.

FIG. 5 illustrates an example of a phase interpolator circuit 500 that can be calibrated in accordance with certain aspects of this disclosure. In the illustrated example, the phase interpolator circuit 500 is based on the phase interpolator illustrated in FIG. 3 and operates in a similar fashion when calibrated for the frequency of an inputted clock signal. The phase interpolator circuit 500 further includes a calibration circuit 520 that may be used to set operating points for the driver circuits 300 and 320. The operating point may be determined or defined by the drive strength of the driver circuits 300 and 320. In the illustrated example, the drive strength of the driver circuits 300 and 320 is selected by the bias voltages 534, 536 (Vbp and Vbn) of bias control transistors 506a, 506b in the first driver circuit 300 and of bias control transistors 508a, 508b in the second driver circuit 320.

The illustrated phase interpolator circuit 500 includes two driver circuits 300 and 320 that are configured to drive a common output 510 with configurable weightings. The first driver circuit 300 receives an input signal 502 (In_I) that is an in-phase version of the inputted clock signal and contributes an output current to the common output 510 at a current level controllable using the variable load transistors 304 and 306. A second driver circuit 320 receives an input signal 504 (In_Q) that is a quadrature version of the inputted clock signal and contributes an output current to the common output 510 at a current level controllable using the variable load transistors 324 and 326. The driver circuits 300 and 320 can contribute to the common output 510 by sourcing or sinking their respective output currents. The contributions of the driver circuits 300 and 320 to the instantaneous amplitude of current flowing through the common output 510 may be additive or subtractive according to the phase of the inputted clock signal. A buffer circuit 548 may be configured to condition the output 550 of the phase interpolator 500. For example, the buffer circuit 548 may be configured to square the edges of the output 550 of the phase interpolator 500 such that transitions in the output 550 represent a small fraction of the duration of the half-cycle of the inputted clock signal.

Figure 6:
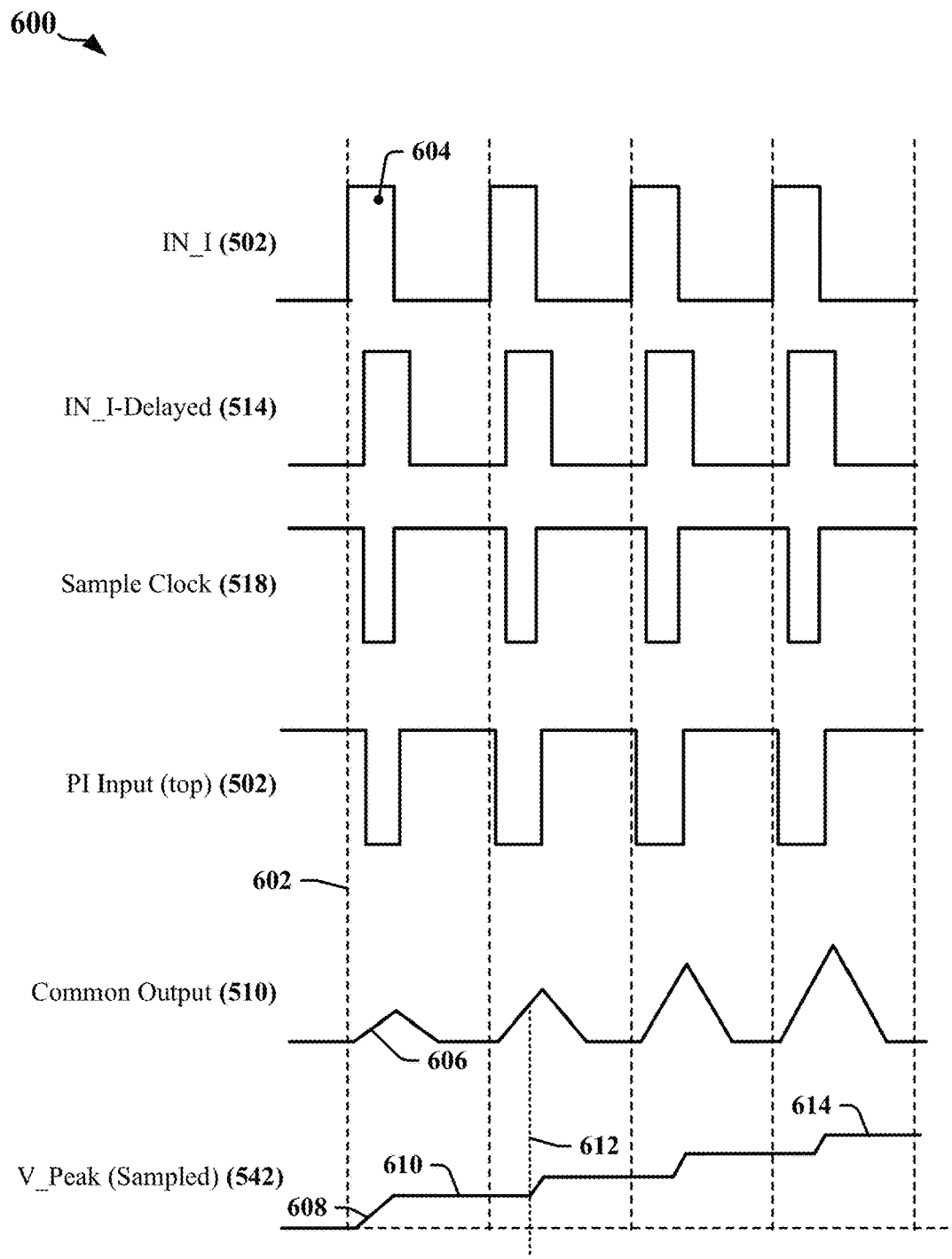
FIG. 6 illustrates the operation of a calibration circuit in accordance with certain aspects of the present disclosure.

With reference also to the timing diagram 600 of FIG. 6, the driver circuits 300 and 320 can be configured to select a phase bounded by the phases of the in-phase and quadrature versions of the inputted clock signal when the rise time for a transition between signaling states in the outputs of the driver circuits 300 and 320 is substantially equal to the duration of a pulse 602 in the inputted clock signal. In a nominal case, the duration of the pulse 602 may correspond to the duration of a half-cycle of the inputted clock signal. In some instances, the duration of the pulse may be greater or less than the half-cycle of the inputted clock signal. The frequency of the inputted clock signal defines the duration of the half-cycle of the inputted clock signal and, according to certain aspects of this disclosure, the frequency of the inputted clock signal may be associated with an operating point of the phase interpolator circuit 500. An operating point of the phase interpolator circuit 500 may be selected when the bias voltages 534, 536 of the bias control transistors 506a, 506b, 508a, 508b are configured to cause transitions in the outputs of the driver circuits 300 and 320 to complete after a duration corresponding to a half-cycle of the inputted clock signal.

According to certain aspects of this disclosure, the bias voltages 534, 536 provided to the bias control transistors 506a, 506b, 508a, 508b may be calibrated for a given duration of the pulse 602 and/or the clock signal frequency. The bias voltages 534, 536 may be calibrated to accommodate variations in timing caused by PVT conditions. The calibration process involves configuring the calibration circuit 520 to set the bias voltages 534, 536 at a level that provides a longest rise time for transitions in the outputs of the driver circuits 300 and 320, and incrementally modifying the bias voltages until the rise time of transitions in the outputs of the driver circuits 300 and 320 is optimized. In one example, the rise time of transitions in the outputs of the driver circuits 300 and 320 is optimized when a transition is completed after a duration that is substantially equal to the duration of the pulse 602. In another example, the rise time of transitions in the outputs of the driver circuits 300 and 320 is optimized when a transition is completed within the duration of the pulse 602. In another example, the rise time of transitions in the outputs of the driver circuits 300 and 320 is optimized when a transition is completed after a duration that is within a time range that includes the duration of the pulse 602. In the latter example, the size of the time range may be defined by tolerances during design of the phase interpolator circuit 500.

In the illustrated example, the calibration circuit 520 in the phase interpolator circuit 500 includes a sampling circuit, a counter 528 and a digitally controlled voltage source 530. The sampling circuit may be implemented using a holding capacitor 524, and P-type metal-oxide-semiconductor (PMOS) transistor 522 configured as a switch. The source of the PMOS transistor 522 is configured to couple the common output 510 of the driver circuits 300, 320 to a terminal of the holding capacitor 524 under the control of a sampling clock signal 518 that is coupled to the gate of the PMOS transistor 522.

The sampling clock signal 518 is generated from the input signal 502 that is an in-phase version of the clock signal inputted to the phase interpolator circuit 500. In the illustrated example, the sampling clock signal 518 is obtained from an inverted AND (NAND) gate 516 which gates the input signal 502 with a delayed version 514 of the input signal 502. The resultant sampling clock signal 518 output by the NAND gate 516 turns on the PMOS transistor 522 at a point in time 604 that occurs after the beginning of the pulse 602 based on the delay introduced by delay element 512. The voltage 608 across the holding capacitor 524 follows the voltage 606 of the common output 510 when the PMOS transistor 522 is turned on. The PMOS transistor 522 is turned off at the end of the pulse 602. The sampling clock signal 518 is configured to enable the holding capacitor 524 to be charged such that the voltage across the holding capacitor 524 represents the peak voltage of the common output 510 of the driver circuits 300, 320 at the time when the PMOS transistor 522 is turned off.

In the illustrated example, the calibration circuit 520 includes a comparator 526 that compares the sampled peak voltage 542 with a reference voltage level 544. The reference voltage level 544 represents the minimum voltage level 614 that would indicate an optimal rise time for the common output 510 of the driver circuits 300, 320. The sampled peak voltage 542 fails to reach the reference voltage level 544 when the rise time of the common output 510 of the driver circuits 300, 320 is slower than needed to accommodate the duration of the pulse 602. The output 546 of the comparator 526 may be used to control the operation of the counter 528. In one example, the output 546 of the comparator 526 is in a first signaling state that enables the counter 528 to count when the sampled peak voltage 542 is less than the reference voltage level 544, and is in a second signaling state that disables the counter 528 when the sampled peak voltage 542 equals or exceeds the reference voltage level 544. In some implementations the delay element 512 is configured to produce a delay that prevents the PMOS transistor 522 from being turned on until a time 612 at which the voltage of the common output 510 has reached or exceeded the previous peak voltage level 610. In these latter implementations, the calibration circuit 520 can ensure that the counter 528 is not momentarily re-enabled due to early sampling of the common output 510 within the duration of the pulse 602.

In the illustrated example, the output of the counter 528 provides a 5-bit count value 538 that is used to configure the digitally controlled voltage source 530. The 5-bit count value 538 is used to control the voltage drop across the N-type metal-oxide-semiconductor (NMOS) transistor 532, and the voltage on the drain of NMOS transistor 532 defines the bias voltage 534 (Vbp) of bias control transistors 506a, 508a. The calibration circuit 520 also defines the bias voltage 536 (Vbn) of bias control transistors 506b, 508b. Other types of digitally controlled voltage sources 530 may be used.

In the illustrated example, the counter 528 is incremented by a counter clock signal 540 when the counter 528 is enabled. The counter 528 may ignore the counter clock signal 540 when disabled. The operation of the comparator 526 and the counter clock signal 540 can enable automatic control of each cycle of the calibration process. In some implementations, the counter clock signal 540 may have a frequency that is less than half the minimum frequency expected for the input signal 502 received by first driver circuit 300. In some instances, the counter clock signal 540 has a frequency that is an order of magnitude slower than the minimum frequency expected for the input signal 502. In these implementations, calibration commences when the counter 528 is reset to zero, causing slowest rise time and a low sampled peak voltage 542. The comparator 526 detects that the sampled peak voltage 542 is less than the reference voltage level 544 and enables the counter 528. The counter 528 is then incremented after every cycle of the counter clock signal 540 until the comparator 526 detects that the sampled peak voltage 542 is equal to or greater than the reference voltage level 544 and disables the counter 528. The 5-bit count value 538 may be locked until a recalibration is performed.

In some implementations, a controller in the receiver may cause the phase interpolator circuit 500 to be calibrated for a number of possible input clock frequencies. The controller may cause a first frequency to be provided as an input to the phase interpolator circuit 500, reset the counter 528 and wait until a 5-bit count value 538 is locked. The controller may capture the 5-bit count value 538 and store it as a code associated with the first frequency. The controller may perform this calibration process for multiple clock frequencies and may maintain a number of codes associated with different input clock frequencies. In some instances, the controller may directly load the counter 528 when configuring the receiving device to operate at a selected clock frequency.

Figure 7:
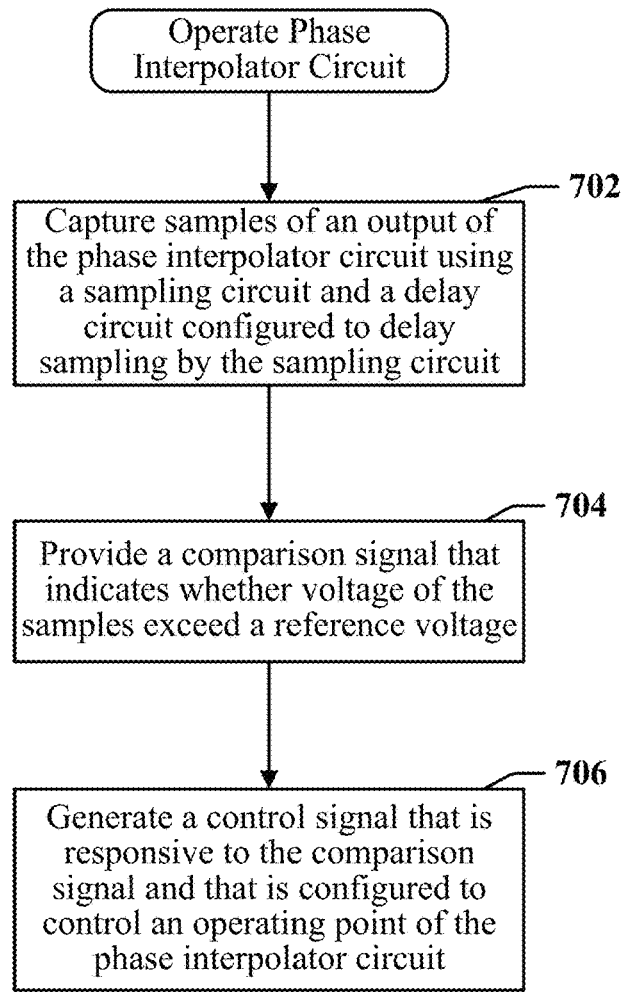
FIG. 7 is a flow diagram illustrating an example of a method for operating a phase interpolator circuit in accordance with certain aspects of the present disclosure.

FIG. 7 is a flow diagram illustrating an example of a method 700 for operating a phase interpolator circuit. In one example, the phase interpolator circuit corresponds to the phase interpolator circuit 500 of FIG. 5. The method 700 may be implemented in a receiver coupled to a data communication link. At block 702, samples of an output of the phase interpolator circuit may be captured using a sampling circuit. A delay circuit may be configured to delay sampling by the sampling circuit. At block 704, a comparison signal may be provided or generated. In one example, the comparison signal indicates whether voltage of the samples exceed a reference voltage. At block 706, a control signal is generated. The control signal may be responsive to the comparison signal and may be configured to control an operating point of the phase interpolator circuit.

In certain examples, an output signal generated by the phase interpolator circuit is representative of a weighted sum of a pair of input signals received by the phase interpolator circuit. The pair of input signals may be received by a pair of driver circuits. The driver circuits may be configured to concurrently drive the output of the phase interpolator circuit. In one example, the input signals are phase-shifted versions of a clock signal received by the phase interpolator circuit. The input signals may have a same frequency and may be phase-shifted with respect to one another.

In various implementations, the operation of a counter may be controlled using the comparison signal. For example, the counter may be enabled or otherwise caused to count cycles of a clock signal until the comparison signal indicates that the voltage of the samples exceeds the reference voltage. An output of the counter may be used to configure one or more biasing circuits in the pair of driver circuits. In some instances, the output of the counter configures one or more current sources used to configure the pair of driver circuits. In some instances, the output of the counter configures a digitally controlled voltage source that controls an operating point for the pair of driver circuits.

The driver circuit in the pair of driver circuits may each have one or more load transistors configured to control a corresponding level of current contributed to the output signal. The operating point of the phase interpolator circuit may be one of a plurality of operating points associated with different frequencies of an input signal received by the phase interpolator circuit. The different frequencies may be defined by design or may be accommodated when encountered. The sampling circuit may be configured to capture the samples during one pulse in an input signal received by the phase interpolator circuit.

The apparatus and methods described herein and illustrated in the accompanying drawings may be implemented using various blocks, modules, components, circuits, steps, processes, algorithms, etc. (collectively referred to as "elements"). These elements may be implemented using electronic hardware, computer software, or any combination thereof. Whether such elements are implemented as hardware or software depends upon the particular application and design constraints imposed on the overall system According to certain aspects of his disclosure, an apparatus configured to operate as a phase interpolator circuit includes circuits or modules configured to capture samples of an output of the apparatus, circuits or modules configured to provide a comparison signal that indicates whether voltage of the samples exceed a reference voltage, and circuits or modules configured to generate a control signal that is responsive to the comparison signal and that is configured to control an operating point of the apparatus. The circuits or modules configured to capture samples may include a delay circuit configured to delay sampling by a sampling circuit. In some implementations, the sampling circuit is configured to capture the samples during one pulse in an input signal received by the apparatus. The apparatus may further include circuits or modules configured to generate an output signal representative of a weighted sum of a pair of input signals received by the apparatus. The circuits or modules configured to generate the output signal may include a pair of driver circuits configured to concurrently drive the output of the apparatus. The pair of input signals may have a same frequency and may be phase-shifted with respect to one another.

In some examples, the circuits or modules configured to generate the output signal includes a counter responsive to the comparison signal. An output of the counter may be used to configure one or more biasing circuits in the pair of driver circuits. In one example, the output of the counter configures one or more current sources used to configure the pair of driver circuits. In another example, the output of the counter configures a digitally controlled voltage source that controls an operating point for the pair of driver circuits. The counter may be configured to count cycles of a clock signal until the comparison signal indicates that the voltage of the samples exceeds the reference voltage.

In certain examples, each of the driver circuits includes one or more load transistors configured to control a corresponding level of current contributed to the output signal.

In certain examples, the operating point of the apparatus is configured for the frequency of the pair of input signals. The operating point of the apparatus can be one of multiple operating points that are configured for different frequencies of an input signal received by the apparatus.

In accordance with at least one example described herein, a phase interpolator has a sampling circuit configured to capture samples of an output of the phase interpolator, a delay circuit configured to delay sampling by the sampling circuit, a comparator configured to provide a comparison signal that indicates whether voltage of the samples exceed a reference voltage, and a counter responsive to the comparison signal and configured to provide an output that controls an operating point of the phase interpolator. The phase interpolator may also have a pair of driver circuits configured to concurrently drive the output of the phase interpolator. The output of the counter may be used to configure one or more biasing circuits in the pair of driver circuits. In some instances, the output of the counter configures one or more current sources used to configure the pair of driver circuits. In some instances, the output of the counter configures a digitally controlled voltage source that controls an operating point for the pair of driver circuits.

In certain instances, the pair of driver circuits is coupled to a pair of input signals that have the same frequency and are phase-shifted with respect to one another. The pair of driver circuits may be configured to generate a weighted sum of the pair of input signals. Each driver circuit in the pair of driver circuits may include one or more load transistors configured to control a level of current contributed by the driver circuit to the output of the phase interpolator. The operating point of the phase interpolator may be configured for the frequency of the pair of input signals. The operating point of the phase interpolator can be one of a plurality of operating points configured for different frequencies of an input signal received by the phase interpolator. The sampling circuit may be configured to capture the samples during one pulse in an input signal received by the phase interpolator. The counter may be configured to count cycles of a clock signal until the comparison signal indicates that the voltage of the samples exceeds the reference voltage.

Some implementation examples are described in the following numbered clauses:

1. A phase interpolator comprising: a sampling circuit configured to capture samples of an output of the phase interpolator; a delay circuit configured to delay sampling by the sampling circuit; a comparator configured to provide a comparison signal that indicates whether voltage of the samples exceed a reference voltage; and a counter responsive to the comparison signal and configured to provide an output that controls an operating point of the phase interpolator.
2. The phase interpolator as described in clause 1, further comprising: a pair of driver circuits configured to concurrently drive the output of the phase interpolator.
3. The phase interpolator as described in clause 2, wherein the output of the counter configures one or more biasing circuits in the pair of driver circuits.
4. The phase interpolator as described in clause 2 or clause 3, wherein the output of the counter configures one or more current sources used to configure the pair of driver circuits.
5. The phase interpolator as described in clause 2 or clause 3, wherein the output of the counter configures a digitally controlled voltage source that controls an operating point for the pair of driver circuits.
6. The phase interpolator as described in any of clauses 2-5, wherein the pair of driver circuits is coupled to a pair of input signals that have the same frequency and are phase-shifted with respect to one another, and wherein the pair of driver circuits is configured to generate a weighted sum of the pair of input signals.
7. The phase interpolator as described in clause 6, wherein each driver circuit in the pair of driver circuits comprises one or more load transistors configured to control a level of current contributed by the each driver circuit to the output of the phase interpolator.

8. The phase interpolator as described in clause 6 or clause 7, wherein the operating point of the phase interpolator is configured for a frequency of the pair of input signals.

9. The phase interpolator as described in any of clauses 1-8, wherein the operating point of the phase interpolator is one of a plurality of operating points configured for different frequencies of an input signal received by the phase interpolator.

10. The phase interpolator as described in any of clauses 1-9, wherein the sampling circuit is configured to capture the samples during one pulse in an input signal received by the phase interpolator.

11. The phase interpolator as described in any of clauses 1-10, wherein the counter is configured to count cycles of a clock signal until the comparison signal indicates that the voltage of the samples exceeds the reference voltage.

12. An apparatus comprising: means for capturing samples of an output of the apparatus, comprising a delay circuit configured to delay sampling by a sampling circuit; means for providing a comparison signal that indicates whether voltage of the samples exceed a reference voltage; and means for generating a control signal that is responsive to the comparison signal and that is configured to control an operating point of the apparatus.

13. The apparatus as described in clause 12, further comprising: means for generating an output signal representative of a weighted sum of a pair of input signals received by the apparatus, including a pair of driver circuits configured to concurrently drive the output of the apparatus, wherein the pair of input signals have a same frequency and are phase-shifted with respect to one another.

14. The apparatus as described in clause 13, wherein the means for generating the control signal comprises a counter responsive to the comparison signal, wherein an output of the counter configures one or more biasing circuits in the pair of driver circuits.

15. The apparatus as described in clause 14, wherein the output of the counter configures one or more current sources used to configure the pair of driver circuits.

16. The apparatus as described in clause 14, wherein the output of the counter configures a digitally controlled voltage source that controls an operating point for the pair of driver circuits.

17. The apparatus as described in any of clauses 14-16, wherein the counter is configured to count cycles of a clock signal until the comparison signal indicates that the voltage of the samples exceeds the reference voltage.

18. The apparatus as described in any of clauses 13-17, wherein each driver circuit in the pair of driver circuits comprises one or more load transistors configured to control a corresponding level of current contributed to the output signal.

19. The apparatus as described in any of clauses 13-18, wherein the operating point of the apparatus is configured for the frequency of the pair of input signals.

20. The apparatus as described in any of clauses 12-19, wherein the operating point of the apparatus is one of a plurality of operating points configured for different frequencies of an input signal received by the apparatus.

21. The apparatus as described in any of clauses 12-20, wherein the sampling circuit is configured to capture the samples during one pulse in an input signal received by the apparatus.

22. A method for operating a phase interpolator circuit comprising: capturing samples of an output of the phase interpolator circuit using a sampling circuit and a delay circuit configured to delay sampling by the sampling circuit; providing a comparison signal that indicates whether voltage of the samples exceed a reference voltage; and generating a control signal that is responsive to the comparison signal and that is configured to control an operating point of the phase interpolator circuit.

23. The method as described in clause 22, further comprising: generating an output signal representative of a weighted sum of a pair of input signals received by the phase interpolator circuit using a pair of driver circuits configured to concurrently drive the output of the phase interpolator circuit, wherein the pair of input signals have a same frequency and are phase-shifted with respect to one another.

24. The method as described in clause 23, wherein generating the control signal comprises: controlling operation of a counter using the comparison signal, wherein an output of the counter configures one or more biasing circuits in the pair of driver circuits.

25. The method as described in clause 24, wherein the output of the counter configures one or more current sources used to configure the pair of driver circuits.

26. The method as described in clause 24, wherein the output of the counter configures a digitally controlled voltage source that controls an operating point for the pair of driver circuits.

27. The method as described in any of clauses 24-26, further comprising: causing the counter to count cycles of a clock signal until the comparison signal indicates that the voltage of the samples exceeds the reference voltage.

28. The method as described in any of clauses 23-27, wherein each driver circuit in the pair of driver circuits comprises one or more load transistors configured to control a corresponding level of current contributed to the output signal.

29. The method as described in any of clauses 22-28, wherein the operating point of the phase interpolator circuit is one of a plurality of operating points associated with different frequencies of an input signal received by the phase interpolator circuit.

30. The method as described in any of clauses 22-29, wherein the sampling circuit is configured to capture the samples during one pulse in an input signal received by the phase interpolator circuit.

As used herein, a phrase referring to "at least one of" a list of items refers to any combination of those items, including single members. As an example, "at least one of: a, b, or c" is intended to cover a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

The present disclosure is provided to enable any person skilled in the art to make or use aspects of the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but is to be accorded the widest scope consistent with the principles and novel features disclosed herein.

What is claimed is:

1. A phase interpolator comprising:
a pair of driver circuits including a first driver circuit configured to drive an output clock signal with a weighted in-phase version of an input clock signal and a second driver circuit configured to drive the output clock signal with a weighted quadrature version of the input clock signal;
a sampling circuit configured to capture samples of the output clock signal;
a comparator configured to provide a comparison signal that indicates whether voltages of the samples of the output clock signal exceed a reference voltage; and
a counter that is configured to count while the comparison signal indicates that the voltages of the samples of the output clock signal are less than the reference voltage, wherein a count value output by the counter is used to configure drive strength of the driver circuits.

2. The phase interpolator of claim 1, wherein the counter is configured to receive a counter clock signal that has a frequency that is less than half of a minimum frequency defined for the input clock signal.

3. The phase interpolator of claim 1, wherein the count value output by the counter configures one or more biasing circuits in the pair of driver circuits.

4. The phase interpolator of claim 1, wherein the count value output by the counter configures one or more current sources used to configure the pair of driver circuits.

5. The phase interpolator of claim 1, wherein the count value output by the counter configures a digitally controlled voltage source that controls the drive strength of the driver circuits.

6. The phase interpolator of claim 1, wherein the drive strength of the driver circuits increases after each change in the count value output by the counter.

7. The phase interpolator of claim 1, wherein each driver circuit in the pair of driver circuits comprises one or more load transistors configured to control a level of current contributed by each of the driver circuits to the output clock signal.

8. The phase interpolator of claim 1, wherein the drive strength of the driver circuits is configured for a frequency of the input clock signal.

9. The phase interpolator of claim 1, wherein the drive strength of the driver circuits is configured for an operating point of the phase interpolator that is one of a plurality of operating points configured for different frequencies of the input clock signal.

10. The phase interpolator of claim 1, wherein the sampling circuit is configured to capture the samples during one pulse in the input clock signal.

11. The phase interpolator of claim 1, wherein the counter is configured to count cycles of a counter clock signal until the comparison signal indicates that the voltage of at least one sample of the output clock signal exceeds the reference voltage.

12. An apparatus comprising:
means for mixing in-phase and quadrature versions of an input clock signal using driver circuits configured to drive an output clock signal;
means for capturing samples of the output clock signal;
means for providing a comparison signal that indicates whether voltages of the samples of the output clock signal exceed a reference voltage; and
means for configuring drive strength of the driver circuits, including a counter that is configured to count while the comparison signal indicates that the voltages of the samples of the output clock signal are less than the reference voltage, wherein a count value output by the counter is used to configure the drive strength of the driver circuits.

13. The apparatus of claim 12, wherein the driver circuits comprise:
a first driver circuit configured to drive the output clock signal with a weighted in-phase version of the input clock signal and a second driver circuit configured to drive the output clock signal with a weighted quadrature version of the input clock signal.

14. The apparatus of claim 12, wherein the count value output by the counter configures one or more biasing circuits in the driver circuits.

15. The apparatus of claim 12, wherein the count value output by the counter configures one or more current sources used to configure the driver circuits.

16. The apparatus of claim 12, wherein the count value output by the counter configures a digitally controlled voltage source that controls the drive strength of the driver circuits.

17. The apparatus of claim 12, wherein the counter is configured to count cycles of a counter clock signal until the comparison signal indicates that the voltage of at least one sample of the output clock signal exceeds the reference voltage.

18. The apparatus of claim 12, wherein each driver circuit in the driver circuits comprises one or more load transistors configured to control a corresponding level of current contributed to the output clock signal.

19. The apparatus of claim 12, wherein the drive strength of the driver circuits is configured for a frequency of the input clock signal.

20. The apparatus of claim 12, wherein the drive strength of the driver circuits is configured for an operating point of the apparatus that is one of a plurality of operating points configured for different frequencies of the input clock signal.

21. The apparatus of claim 12, wherein the means for capturing samples of the output clock signal is configured to capture the samples during one pulse in the input clock signal.

22. A method for operating a phase interpolator circuit comprising:
providing in-phase and quadrature versions of an input clock signal to driver circuits configured to drive an output clock signal;
capturing samples of the output clock signal;
providing a comparison signal that indicates whether voltages of the samples of the output clock signal exceed a reference voltage; and
configuring drive strength of the driver circuits using a count value output by a counter that is configured to count while the comparison signal indicates that the voltages of the samples of the output clock signal are less than the reference voltage.

23. The method of claim 22, further comprising:
clocking the counter with a counter clock signal that has a frequency that is less than half of a minimum frequency defined for the input clock signal.

24. The method of claim 22, further comprising:
using the count value output by the counter to configure one or more biasing circuits in the driver circuits.

25. The method of claim 22, further comprising:
using the count value output by the counter to configure one or more current sources used to configure the driver circuits.

26. The method of claim 22, further comprising:
using the count value output by the counter to configure a digitally controlled voltage source that controls an operating point for the driver circuits.

27. The method of claim 22, further comprising:
causing the counter to count cycles of a counter clock signal until the comparison signal indicates that the voltage of at least one sample of the output clock signal exceeds the reference voltage.

28. The method of claim 22, wherein each driver circuit in the driver circuits comprises one or more load transistors configured to control a corresponding level of current contributed to the output clock signal.

29. The method of claim 22, wherein the drive strength of the driver circuits is configured for an operating point of the phase interpolator circuit is one of a plurality of operating points associated with different frequencies of the input clock signal.

30. The method of claim 22, further comprising:
configuring a sampling circuit to capture the samples during one pulse in the input clock signal.

\* \* \* \* \*